(12) United States Patent
Damri

(10) Patent No.: US 12,167,781 B2
(45) Date of Patent: Dec. 17, 2024

(54) PATTERNED DIAMOND AND METHOD OF MAKING SAME

(71) Applicant: CAPSOUL DIAMOND LTD., Alei Zahav (IL)

(72) Inventor: Nirit Damri, Alei Zahav (IL)

(73) Assignee: CAPSOUL DIAMOND LTD., Alei Zahav (IL)

(*) Notice: Subject to any disclaimer, the term of this patent is extended or adjusted under 35 U.S.C. 154(b) by 674 days.

(21) Appl. No.: 17/264,866

(22) PCT Filed: Aug. 1, 2019

(86) PCT No.: PCT/IL2019/050867
§ 371 (c)(1),
(2) Date: Feb. 1, 2021

(87) PCT Pub. No.: WO2020/026245
PCT Pub. Date: Feb. 6, 2020

(65) Prior Publication Data
US 2021/0235824 A1    Aug. 5, 2021

Related U.S. Application Data

(60) Provisional application No. 62/713,563, filed on Aug. 2, 2018.

(51) Int. Cl.
*C30B 25/02* (2006.01)
*A44C 17/00* (2006.01)
(Continued)

(52) U.S. Cl.
CPC .......... *A44C 17/005* (2013.01); *A44C 27/006* (2013.01); *C30B 25/04* (2013.01); *C30B 29/04* (2013.01)

(58) Field of Classification Search
CPC ..... A44C 17/005; A44C 27/006; A44C 27/00; A44C 27/001; A44C 17/007; A44C 17/00; A44C 17/006; C30B 25/04; C30B 29/04
See application file for complete search history.

(56) References Cited

U.S. PATENT DOCUMENTS

| 4,809,417 A | 3/1989 | Normann |
| 5,454,234 A | 10/1995 | Karmeli |

(Continued)

OTHER PUBLICATIONS

International Search Report of Application No. PCT/IL2019/050867 mailed on Nov. 24, 2019.

*Primary Examiner* — Jack W Lavinder
(74) *Attorney, Agent, or Firm* — PEARL COHEN ZEDEK LATZER BARATZ LLP

(57) ABSTRACT

A patterned diamond and methods of making such patterned diamond are disclosed. The patterned diamond may include: a single crystal diamond or a polycrystal diamond; and a metallic pattern embedded in the single crystal diamond or the polycrystal diamond such that, the single crystal diamond or the polycrystal diamond encapsulates the metallic pattern from at least 4 sides. The disclosed method may include providing a first portion of a single crystal diamond or a polycrystal diamond; introducing a metallic pattern to at least one surface of the first portion of the single crystal or a first portion of the polycrystal diamond; and growing, using a CVD process or HTHP process, a second portion of the single crystal diamond or the second portion of the polycrystal diamond on the first portion, such that the single crystal diamond or the polycrystal diamond at least partially encapsulates the metallic pattern.

16 Claims, 4 Drawing Sheets

(51) Int. Cl.
  *A44C 27/00*  (2006.01)
  *C30B 25/04*  (2006.01)
  *C30B 29/04*  (2006.01)

(56) References Cited

U.S. PATENT DOCUMENTS

| | | | |
|---|---|---|---|
| 5,614,019 | A | 3/1997 | Hoover et al. |
| 9,277,792 | B2 | 3/2016 | Grotjohn et al. |
| 10,736,388 | B2 * | 8/2020 | Gloyer .................. A44C 17/006 |
| 2004/0250570 | A1 | 12/2004 | Huynh |
| 2010/0055022 | A1 | 3/2010 | Doering et al. |
| 2010/0297391 | A1 | 11/2010 | Kley |
| 2017/0261855 | A1 | 9/2017 | Moore et al. |
| 2018/0087183 | A1 * | 3/2018 | Misra ...................... C30B 29/04 |
| 2018/0310677 | A1 | 11/2018 | Gloyer et al. |

* cited by examiner

PATTERNED DIAMOND AND METHOD OF MAKING SAME

CROSS-REFERENCE TO RELATED APPLICATIONS

This application is a National Phase Application of PCT International Application No. PCT/IL2019/050867, International Filing Date Aug. 1, 2019, claiming the benefit of U.S. Patent Application No. 62/713,563, filed Aug. 2, 2018, which are hereby incorporated by reference.

FIELD OF THE INVENTION

This invention is related to the field of artificial diamonds and more specifically to the field of patterned artificial diamonds.

BACKGROUND OF THE INVENTION

Diamonds, either natural or artificial, are a luxurious product that is being used mainly in the jewelry industry but also in other applications, such as, sensors, detectors and the like. Decorative diamonds are single crystals, polished to a desired shape. The more perfect the crystal of the diamond is, the higher is its value.

Artificial diamonds are produced using either high-pressure high-temperature (HPHT) methods or chemical vapor deposition (CVD) methods. When using CVD methods a diamond is grown from a hydrocarbon gas mixture. The CVD method allows to grow diamonds over large areas and on various substrates.

When combined with noble metals, such as gold, iridium and platina, diamonds form the most luxurious jewelries. The diamonds are inlaid in the noble metal by a goldsmith. Accordingly, it may be advantages to include the noble metal (or any other metal) inside the diamond crystal to form a completely new type of jewelry or to form a completely new type of device (e.g., a sensor).

SUMMARY OF THE INVENTION

Some aspects of the invention may be directed to a patterned diamond that includes: a single crystal diamond or a polycrystal diamond; and a metallic pattern embedded in the single crystal diamond or the polycrystal diamond. In some embodiments, the single crystal diamond or the polycrystal diamond may encapsulate the metallic pattern from at least 4 sides. In some embodiments, the patterned diamond may be polished such that at least one surface of the metallic pattern is exposed. In some embodiments, at least one exposed surface of the metallic pattern is reaching a facet of the single crystal diamond.

In some embodiments, the metallic pattern may be made from a noble metal or an alloy of a noble metal. In some embodiments, the metallic pattern may be made from an etchable metal configured to be etched away from the single crystal diamond or from the polycrystal diamond via the at least one exposed surface of the metallic pattern. In some embodiments, the etched diamond may include a filler material filling an etched volume in the diamond previously occupied by the metallic pattern. In some embodiments, the filled diamond may include a plug or cork for holding the filler material inside the etched volume. In some embodiments, the filler material may be selected from a group consisting of: a perfume, a sparkling polymer and a fluorescent material.

Some additional aspects of the invention may be related to a set of joined patterned diamonds, the set may include: two or more diamonds, each diamond may include: a single crystal diamond or the polycrystal diamond and a metallic pattern embedded in the single crystal diamond. In some embodiments, each diamond may be polished such that at least one surface of the metallic pattern may be exposed, and the two or more patterned diamonds may be joined to each other via the at least one exposed surface of the metallic pattern of each patterned diamond.

Some aspects of the invention may further be directed to a method of making a patterned diamond. In some embodiments, the method may include providing a first portion of a single crystal diamond or a first portion of a polycrystal diamond; introducing a metallic pattern to at least one surface of the first portion of the single crystal or the first portion of the polycrystal diamond; and growing, using a CVD process or HTHP process, a second portion of the single crystal diamond on the first portion or a second portion of the polycrystal diamond on the first portion, such that the single crystal diamond or the polycrystal diamond at least partially encapsulates the metallic pattern. In some embodiments, providing the first portion of the single crystal diamond may include providing a natural diamond. In some embodiments, providing the first portion of the single crystal diamond may include growing, using the CVD process or the HTHP process, the first portion of the single crystal diamond on a single crystal diamond seed. In some embodiments, providing the first portion of the polycrystal diamond may include growing, using the CVD process or the HTHP process, the first portion of the polycrystal crystal diamond on a polycrystal diamond seed. In some embodiments, introducing the metallic pattern may include depositing one of more layers of melted metal on a surface of the first portion of the single crystal. In some embodiments, introducing the metallic pattern may include: ablating a pattern in the first portion of the single crystal diamond or the first portion of the polycrystal diamond; and filling the ablated pattern with metal. In some embodiments, filling the ablated pattern is with molten metal.

In some embodiments, the method may further include applying a protective coating to at least one area on a surface of the metallic pattern, prior to the growing of the second portion of the diamond. In some embodiments, the protective coating may be configured to prevent the growth of the second portion of the diamond on the coated at least one area. In some embodiments, the method may further include temporarily stopping the growth of the second portion of the diamond; removing the protective coating; and continue growing the second portion of the diamond.

In some embodiments, the CVD process may be conducted at 800-1100° C. In some embodiments, the CVD process may be conducted at temperatures lower than 800° C. or higher than 1100° C. In some embodiments, the method may further include polishing the single crystal diamond or the polycrystal diamond to a desired shape. In some embodiments, polishing may include polishing at least one facet of the single crystal diamond or the polycrystal diamond to expose at least one surface of the 3D metallic pattern. In some embodiments, the metallic pattern may include an etchable metal and the method may further include, etching at least a portion of the pattern by providing an etchant to the exposed at least one surface of the metallic pattern.

In some embodiments, the metallic pattern may be made from a noble metal or an alloy of a noble metal. In some embodiments, joining together two or more patterned diamond via the exposed at least one metallic pattern of each diamond.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
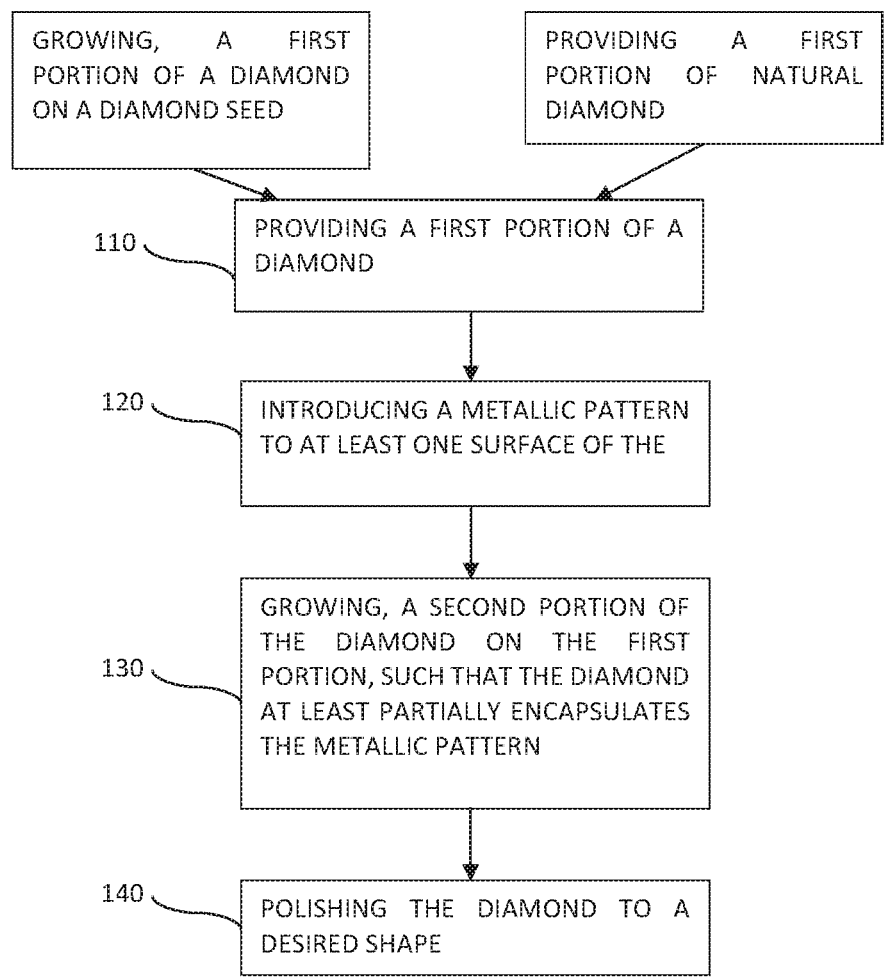
FIG. 1 is a flowchart of a method of making a patterned diamond according to some embodiments of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Aspects of the invention may be related to patterned diamonds made at least partially be CVD methods that includes metallic pattern introduced into the diamond crystal or a diamond polycrystal during the CVD process. Such a metallic pattern may include any three-dimensional (3D) or two-dimensional (2D) shape made, for example, from a noble metal such as gold. A production method according to embodiments of the invention may allow to produce decorative diamonds, or any other element made from CVD diamonds, for example, a watch cristal or window with golden numbers embedded in the diamond glass, a decorative tile made from CVD diamond that includes a golden/platina pattern inside and the like. In some embodiments, production method according to embodiments of the invention may allow to produce diamond-based devices, such as, sensors or may be used in any other application the utilizes diamonds.

Figure 2A:
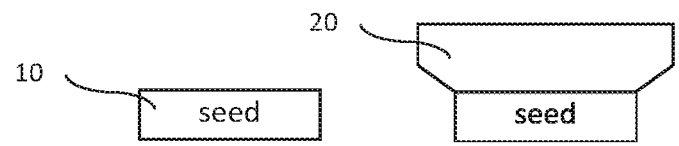
FIGS. 2A-2D are illustrations of various steps in the production of patterned diamonds according to some embodiments of the invention.

Reference is now made to FIG. 1 which is a flowchart of a method of making a patterned diamond according to some embodiments of the invention. In step 110, a first portion of a single crystal diamond or a first portion of a polycrystal diamond may be provided. The first portion of the single crystal diamond may be provided as a natural diamond or may be grown on a single crystal seed using a CVD process or a HPHT process. The first portion of the polycrystal diamond may be grown on a polycrystal seed using a CVD process or a HPHT process. For example, a diamond seed 10 (either single crystal seed or polycrystal seed), illustrated in FIG. 2A may be inserted into a CVD reactor. In some embodiments, a single crystal diamond seed may include a pure single crystal diamond with known growth orientation. In some embodiments, a polycrystal diamond seed may include, for example, polycrystal diamond, a silicon seed covered with small diamonds (microns and/or sub-micron sized diamond crystals), a steel seed covered with small diamonds (microns and/or sub-micron sized diamond crystals) and the like.

A first diamond portion 20 may be grown on seed 10 by introducing a hydrocarbon gas mixture into the reactor. In some embodiments, a single crystal first diamond portion 20 may be grown on a single crystal seed 10. In some embodiments, a polycrystal first diamond portion 20 may be grown on a polycrystal seed 10. In some embodiments, the hydrocarbon gas may be energized and ionized into chemically active radicals in the CVD reactor. The energizing may be conducted using any one of: microwave power, a hot filament, an arc discharge, a welding torch, a laser, an electron beam, and the like. In some embodiments, the CVD process may be conducted at 800-1100° C. under a protective atmosphere. In some embodiments, the CVD process may be conducted at temperatures lower than 800° C. In some embodiments, the CVD process may be conducted at temperatures higher than 1000° C. In such case, decreasing the temperature may lead to decreasing of the growth rate and may lead to adapted additional parameters of the process (e.g., pressure, power, gas mixture and the like). In another example, a diamond seed (either single crystal or polycrystal) may be introduced into a HPHT growth cell. The HPHT growth cell may include: a belt press, a cubic press and a split-sphere (BARS) press. The HPHT growth cell may be feed with highly refined and purified graphite (carbon) and a catalyst of mixed metals and powders that facilitates the diamond growth. The growth cell may be placed at the center of the press machine and may be heated to over 1,300° C. to form over 50,000 atmospheres of pressure.

In box 120, a metallic pattern may be introduced to at least one surface of the first portion of the single crystal diamond or a to at least one surface of the first portion of the polycrystal diamond, for example, inside the CVD reactor or the HTHP growth cell under the protective atmosphere. In some embodiments, the metallic pattern may include any desirable 3D pattern made from any metal having dimensions that are suitable to be included in a diamond. The 3D or 2D pattern may have a shape of a letter, a number, a known geometrical or abstract shape (e.g., a shape of a hart), an arbitrary shape, a logo of a company and the like. In some embodiments, the metallic pattern may be made from a noble metal, such as gold, iridium, platinum, silver, palladium and their alloys. Alternatively, the pattern may be made form any other metal or alloy that may endure the above conditions (e.g., temperature and pressure.

Figure 2B:
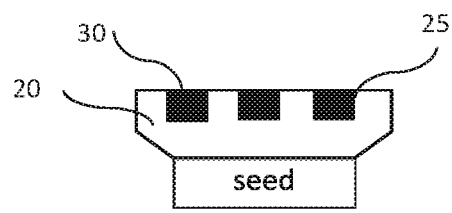

In some embodiments, introducing the metallic pattern may include ablating a pattern in the first portion of the single crystal or the first portion of the polycrystal and filling the ablated pattern with metal. For example, a pattern 25, illustrated in FIG. 2B may be ablated, for example, by laser or any other suitable method, in first portion 20. The ablation may be conducted inside the CVD reactor or the HTHP growth cell or external to the CVD reactor or to the HTHP growth cell. The ablated pattern may be filled with metallic pattern 30, for example, by depositing molten metal at least partially into ablated pattern 25.

Figure 2C:
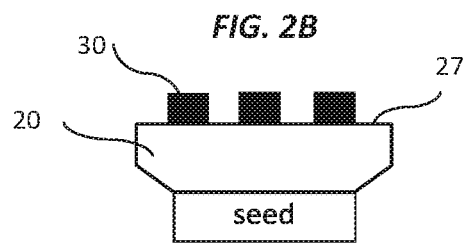

In some embodiments, introducing the metallic pattern may include depositing one of more layers of molten metal on a surface of the first portion of the single crystal. For example, molten metal may be printed, using a 3D printer on surface 27 of first portion 20, to form metallic pattern 30, as illustrated in FIG. 2C. In some embodiments, introducing the metallic pattern may include placing a solid metallic pattern on the surface of the first portion of the single crystal. For example, a solid pattern 30 made, for example, by a goldsmith, may be placed on surface 27 of portion 20 inside the CVD reactor or the HTHP growth cell.

In some embodiments, the method may further include applying a protective coating to at least one area on the surface of the metallic pattern, prior to the growing of a second portion of the diamond. In some embodiments, applying the protective coating may include depositing one of: Al, Ti, Au, $SiO_2$, $Si_3N_4$ and the like on at least one area on the surface of the metallic pattern, for example, one or more side walls of the metallic pattern and the like. In some embodiments, the protective coating may be configured to prevent the growth of the second portion of the diamond on the coated at least one area.

In box 130, the second portion of the single crystal diamond may be grown, using the CVD process or the HTHP process, on the first portion of the single crystal diamond, such that the single crystal diamond at least partially encapsulates the metallic pattern, for example, from at least 4 sides. In some embodiments, in box 130, a second portion of the polycrystal diamond may be grown, using the CVD process or the HTHP process, on the first portion of the polycrystal diamond, such that the polycrystal diamond at least partially encapsulates the metallic pattern. For example, the hydrocarbon gas mixture may be introduced into the CVD reactor, to be energized and ionized into chemically active radicals in the CVD reactor. The energizing may be conducted using any one of: microwave power, a hot filament, an arc discharge, a welding torch, a laser, an electron beam, and the like. In some embodiments, the CVD process may be conducted at 800-1100° C. In some embodiments, the CVD process may be conducted at temperatures lower than 800° C. In some embodiments, the CVD process may be conducted at temperatures higher than 1100° C. In yet another example, first portion 20 and pattern 30 may be introduced into a HPHT growth cell. The HPHT growth cell may be feed with highly refined and purified graphite (carbon) and a catalyst of mixed metals and powders that facilitates the diamond growth. The growth cell may be placed at the center of the press machine and may be heated to over 1300° C. to form over 50,000 atmospheres of pressure.

Figure 2D:
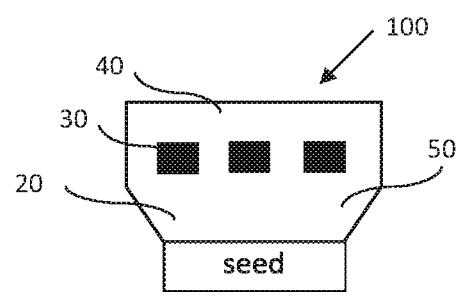

Carbon atoms grow on surface 27 and on top of and around the surfaces of metallic pattern 30 may grow in the same crystallographic orientation as first portion 20, forming second portion 40 of a single crystal 50, as illustrated in FIG. 2D. In case surface 27 is included in polycrystal first portion 20, carbon atoms grow on surface 27 and on top of and around the surfaces of metallic pattern 30 may grow in the same crystallographic orientations or in different crystallographic orientations as the crystals in polycrystal first portion 20, forming second portion 40 of a polycrystal crystal 50. In some embodiments, the deposition/growth process may be stopped such that second portion 40 may not completely cover metallic pattern 30 and a surface of metallic pattern 30 may be left exposed.

In some embodiments, the method may include temporarily stopping the growth of the second portion of the diamond and removing the protective coating. The protective coating may be removed according to any method known in the art, for example, laser ablation, microfabrication etching techniques, plasma-assisted attaching and the like. In some embodiments, after the removal of the protective coating the method may include continue growing the second portion of the diamond.

In some embodiments, the method may further include polishing the single crystal diamond or the polycrystal crystal diamond to a desired shape, using any polishing method known in the art. In some embodiments, the polishing may include polishing at least one facet of the single crystal diamond or the polycrystal crystal diamond to expose at least one surface of the 3D metallic pattern. Accordingly, at least a portion or a surface of the metallic pattern may be exposed, as will be discussed with respect to FIGS. 4 and 5.

A patterned diamond 100 according to embodiments of the invention may include a single crystal diamond 50 or the polycrystal crystal diamond 50 and a metallic pattern 30 embedded in the single crystal diamond or the polycrystal crystal diamond, as illustrated in FIG. 2D. The single crystal diamond 50 or the polycrystal crystal diamond 50 may encapsulate the metallic pattern from at least 4 sides. A single crystal patterned diamond 100 may be fully transparent and may have a color of the single crystal seed. A polycrystal patterned diamond 100 may vary between fully transparent to completely dark.

Figure 3:
FIG. 3 is an illustration of a patterned diamond according to some embodiments of the invention.

Reference is now made to FIG. 3 which is an illustration of a patterned diamond according to some embodiments of the invention. A patterned diamond 200 may include a single crystal diamond 250 or the polycrystal crystal diamond 250 and a metallic pattern 230 embedded in single crystal diamond 250 or the polycrystal crystal diamond 250. In some embodiments, single crystal diamond 250 or the polycrystal crystal diamond 250 may encapsulate metallic pattern 230 from all sides. In some embodiments, metallic pattern 230 may have any desired shape, for example, a star, as illustrated in FIG. 3. In some embodiments, metallic pattern 230 may be made from a noble metal, for example, gold, platinum, iridium, silver and the like. In some embodiments, diamond 200 may be polished to any desirable shape, for example, oval, radiant, pear, heart and emerald, illustrated in FIG. 3.

Figure 4A:
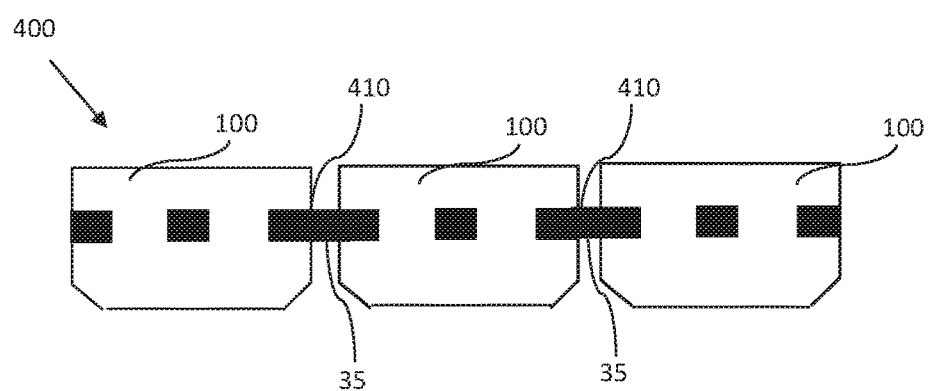
FIGS. 4A and 4B are illustrations of sets of joined patterned diamonds according to some embodiments of the invention.
Figure 4B:
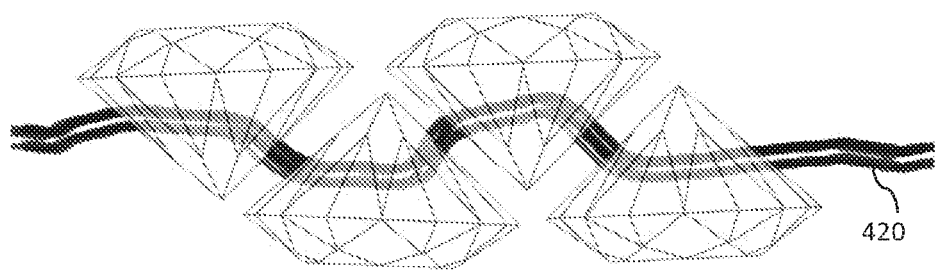

Reference in now made to FIGS. 4A and 4B which are illustrations of sets of joined diamonds according to some embodiments of the invention. A set of joined patterned diamonds 400 may include two or more patterned diamonds 100 (either single diamond crystal or polycrystal diamond) having a metallic pattern 410 embedded therein, each of diamonds 100 may be polished such that at least one surface of the metallic pattern 410 is exposed. In some embodiments, the two or more diamonds 100 may be joined to each other at an exposed surfaces of metallic pattern 410 of each diamond 100, for example, by connectors 35. Connectors 35 may be made from the same metal or alloy of metallic pattern 410 and may be connected by, for example, welding. In some embodiments, connectors 35 may be made from the same metal or different materials and may include, for example, chains, threaded beads, buckles and the like, for example, chains 420 illustrated in FIG. 4B.

In some embodiments, the method of FIG. 1 may further include joining together two or more patterned diamonds via the exposed at least one metallic pattern of each patterned diamond, for example, as disclosed herein above.

Figure 5:
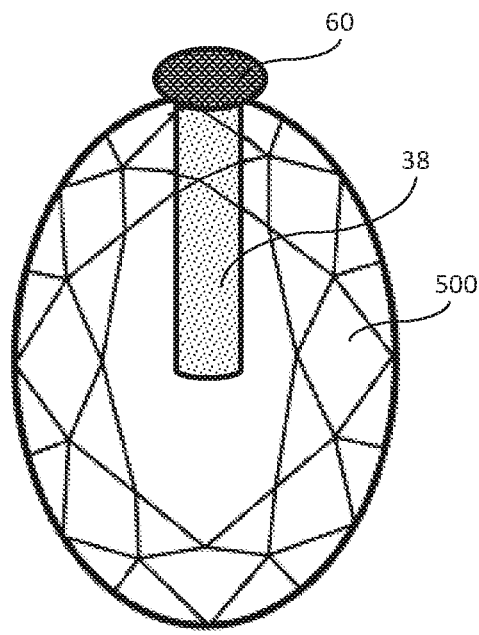
FIG. 5 is an illustration of a hollow diamond filled with a filler according to some embodiments of the invention.

Reference is now made to FIG. 5 which is an illustration of a diamond 500 that includes a filler material filling a volume made inside the diamond, according to some embodiments of the invention. In some embodiments, the metallic pattern may be made from an etchable metal. Such diamond 500 may be polished to expose one surface of the metallic pattern. In some embodiments, the metallic pattern may be etched away from the single crystal diamond or the polycrystal diamond via the at least one exposed surface of the metallic pattern. For example, the metallic pattern may include copper or copper alloys and a method according to embodiments of the invention may include using copper etcher, such as, solutions of: Ferric Chloride ($FeCl_3$), Cupric Chloride ($CuCl_2$), Hydrogen Peroxide-Sulphuric Acid, Chromic-Sulphuric Acid, citric acid and the like to remove the metallic pattern from the diamond. The diamond having a surface of the metallic pattern exposed by polishing may be immersed in the solution until all or some of the metallic pattern is removed, leaving a free volume inside the diamond.

In some embodiments, the etched volume in the diamond previously occupied by the metallic pattern may than be filled with a filler 38 illustrated in FIG. 5. Filler 38 may include: a perfume, a sparkling polymer, a fluorescent material or any filler that may be introduced into the diamond. In some embodiments, the diamond may further include a plug or cork 60 for holding the filler material inside the etched volume. For example, plug or cork 60 may include a polymer that may form a membrane that allows a perfume held as filler 38 to controllably evaporate from plug or cork 60 over a predetermined period of time. In some embodiments, following the evaporation a perfume may be refilled in the free volume in diamond 500.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method of making a diamond, the method comprising:
   providing a first portion of one of: a single crystal diamond and a polycrystal diamond;
   introducing a metallic pattern to at least one surface of the first portion of one of: the single crystal and the polycrystal diamond;
   growing, using one of: a chemical vapor deposition (CVD) process and a high temperature high pressure (HTHP) process, a second portion of one of: the single crystal diamond and the polycrystal diamond on the first portion, such that one of: the single crystal diamond and the polycrystal diamond at least partially encapsulates the metallic pattern; and
   applying a protective coating to at least one area on a surface of the metallic pattern, prior to the growing of the second portion of the diamond.

2. The method of claim 1, wherein providing the first portion comprises a natural diamond.

3. The method according to claim 1, wherein the protective coating is configured to prevent the growth of the second portion of the diamond on the coated at least one area.

4. The method according to claim 1, further comprising:
   temporarily stopping the growth of the second portion of the diamond;
   removing the protective coating; and
   continue growing the second portion of the diamond.

5. The method of claim 1, wherein introducing the metallic pattern comprises placing a solid metallic pattern on a surface of the first portion.

6. The method of claim 1, further comprising polishing one of: the single crystal diamond and the polycrystal diamond to a desired shape.

7. A diamond encapsulating a metallic pattern made by the method of claim 1.

8. A method of making a diamond, the method comprising:
   providing a first portion of one of: a single crystal diamond and a polycrystal diamond;
   introducing a metallic pattern to at least one surface of the first portion of one of: the single crystal and the polycrystal diamond; and
   growing, using one of: a chemical vapor deposition (CVD) process and a high temperature high pressure (HTHP) process, a second portion of one of: the single crystal diamond and the polycrystal diamond on the first portion, such that one of: the single crystal diamond and the polycrystal diamond at least partially encapsulates the metallic pattern,
   wherein introducing the metallic pattern comprises depositing one or more layers of melted metal on a surface of the first portion.

9. The method of claim 8, further comprising polishing one of: the single crystal diamond and the polycrystal diamond to a desired shape.

10. A diamond encapsulating a metallic pattern made by the method of claim 8.

11. The method of claim 8, wherein providing the first portion comprises a natural diamond.

12. A method of making a diamond, the method comprising:
   providing a first portion of one of: a single crystal diamond and a polycrystal diamond;
   introducing a metallic pattern to at least one surface of the first portion of one of: the single crystal and the polycrystal diamond; and
   growing, using one of: a chemical vapor deposition (CVD) process and a high temperature high pressure (HTHP) process, a second portion of one of: the single crystal diamond and the polycrystal diamond on the first portion, such that one of: the single crystal diamond and the polycrystal diamond at least partially encapsulates the metallic pattern,
   wherein introducing the metallic pattern comprises:
   ablating a pattern in the first portion; and
   filling the ablated pattern with metal.

13. The method of claim 12, wherein filling the ablated pattern is with molten metal.

14. The method of claim 12, further comprising:
   polishing one of: the single crystal diamond and the polycrystal diamond to a desired shape.

15. A diamond encapsulating a metallic pattern made by the method of claim 12.

16. The method of claim 12, wherein providing the first portion comprises a natural diamond.

* * * * *